United States Patent
Kim et al.

(10) Patent No.: US 12,032,788 B2
(45) Date of Patent: *Jul. 9, 2024

(54) TOUCH DISPLAY DEVICE, METHOD OF DRIVING THE SAME, AND TIMING CONTROLLER

(71) Applicant: LX SEMICON CO., LTD., Daejeon (KR)

(72) Inventors: Young Gi Kim, Daejeon (KR); Jae Woo Jeon, Daejeon (KR); Young Hoon Bin, Daejeon (KR); Hae Won Lee, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/139,730

(22) Filed: Apr. 26, 2023

(65) Prior Publication Data
US 2023/0259237 A1 Aug. 17, 2023

Related U.S. Application Data

(63) Continuation of application No. 17/552,661, filed on Dec. 16, 2021, now Pat. No. 11,650,698.

(30) Foreign Application Priority Data

Dec. 18, 2020 (KR) .................. 10-2020-0178629

(51) Int. Cl.
  *G06F 3/041* (2006.01)
  *G06F 3/044* (2006.01)
  *G09G 3/20* (2006.01)

(52) U.S. Cl.
  CPC .......... *G06F 3/04184* (2019.05); *G06F 3/044* (2013.01); *G09G 3/20* (2013.01); *G09G 2310/08* (2013.01); *G09G 2320/02* (2013.01)

(58) Field of Classification Search
  CPC ....... G06F 3/04184; G06F 3/044; G09G 3/20; G09G 2310/08; G09G 2320/02
  See application file for complete search history.

(56) References Cited

U.S. PATENT DOCUMENTS

| 9,582,114 B2 | 2/2017 | Krah |
| 2016/0062548 A1 | 3/2016 | Kwon |

(Continued)

FOREIGN PATENT DOCUMENTS

| KR | 10-2015-0028402 A | 3/2015 |
| KR | 10-2018-0018983 A | 2/2018 |

(Continued)

OTHER PUBLICATIONS

Notice of Allowance from corresponding U.S. Appl. No. 17/552,661, dated Jan. 11, 2023.

*Primary Examiner* — Michael Pervan
(74) *Attorney, Agent, or Firm* — ROTHWELL, FIGG, ERNST & MANBECK, P.C.

(57) ABSTRACT

Disclosed herein is a touch display device including a panel driver configured to drive gate lines and data lines of a panel and drive and sense touch electrodes, and a timing controller configured to control a drive timing and an output of the panel driver, wherein the timing controller time-divisionally drives each frame period into a plurality of display operation periods and a plurality of touch operation periods such that each display operation period and each touch operation period alternate and, during at least one compensation period of a first compensation period adjacent to an immediately preceding touch operation period and a second compensation period adjacent to an immediately following touch operation period in each display operation period, compensates at least one of a data signal and a gate signal, (Continued)

which is to be supplied to a compensation area, according to a variation in state of a panel.

20 Claims, 6 Drawing Sheets

(56) References Cited

U.S. PATENT DOCUMENTS

2018/0120995 A1   5/2018  Lee et al.
2022/0197474 A1   6/2022  Kang et al.

FOREIGN PATENT DOCUMENTS

| KR | 10-2089332 B1 | 3/2020 |
| KR | 10-2215876 B1 | 2/2021 |

TOUCH DISPLAY DEVICE, METHOD OF DRIVING THE SAME, AND TIMING CONTROLLER

CROSS-REFERENCE TO RELATED APPLICATIONS

This application is a continuation of U.S. patent application Ser. No. 17/552,661, filed on Dec. 16, 2021, which claims the benefit of the Korean Patent Application No. 10-2020-0178629 filed on Dec. 18, 2020, which are hereby incorporated by reference as if fully set forth herein.

FIELD OF THE INVENTION

The present disclosure relates to a touch display device capable of reducing distortion of an image display in a display operation period after a touch operation, and a method of driving the same.

BACKGROUND

Touch sensors capable of inputting information using a touch on a screen of a display are being widely applied to various displays, such as laptop computers, monitors, and home appliances, as well as portable information devices such as smart phones.

Touch sensors applied to a display include add-on type touch sensors in which a touch panel is attached on a display panel and in-cell type touch sensors in which a touch electrode is embedded in the display panel. As the in-cell type touch sensor, an advanced in-cell touch (AIT) type touch sensor in which a common electrode of a liquid crystal display is divided and used as a touch electrode is known.

Since an AIT display device provides both of an image display function and a touch sensing function through a panel, the AIT display device operates to divide each frame period divided into a display operation period and a touch operation period.

However, the AIT touch display device has a problem in that, since a state inside the panel is changed according to a touch operation, the image display is distorted during a display operation after the touch operation and thus degradation of image quality, such as a horizontal line, occurs.

SUMMARY

Accordingly, according to the present disclosure, there are provided a touch display device capable of reducing distortion of an image display in a display operation period after a touch operation, and a method of driving the same.

According to an aspect of the present disclosure, there is provided a touch display device including a panel driver configured to drive gate lines and data lines of a panel and drive and sense touch electrodes, and a timing controller configured to control a drive timing and an output of the panel driver.

The timing controller may time-divisionally drive each frame period into a plurality of display operation periods and a plurality of touch operation periods such that each display operation period and each touch operation period alternate and, during at least one compensation period of a first compensation period adjacent to an immediately preceding touch operation period and a second compensation period adjacent to an immediately following touch operation period in each display operation period, may compensate at least one of a data signal and a gate signal, which is to be supplied to a compensation area, according to a variation in state of a panel during the touch operation period.

Compensation data for compensating for the variation in state of the panel and information on the compensation area may be preset and stored in a compensation information register of the timing controller.

The timing controller may add different or identical compensation data for each horizontal line to data of subpixels belonging to the compensation area so as to compensate the data.

The timing controller may perform compensation by adjusting pulse widths or voltage levels of the gate signals of the gate lines belonging to the compensation area to be the same or to be different from each other for each gate line during the compensation period.

The timing controller may include a memory configured to store input data, and a display data calculator configured to apply the compensation data, which is provided from the compensation information register according to the information on the compensation area during each compensation period of each display operation period, to data of subpixels belonging to the compensation area, output the compensated data, and output data provided from the memory without compensation during the remaining period of each display operation period.

The timing controller may include a gate control signal calculator configured to generate a gate compensation signal for adjusting the pulse width of the gate signal of the gate lines belonging to the compensation area according to the information on the compensation area and compensation information provided from the compensation information register during each compensation period of the display operation period, and a gate control signal generator configured to generate and output, using synchronization signals and the gate compensation signal, gate control signals for controlling a gate driver of the panel drivers during each display operation period.

According to another aspect of the present disclosure, there is provided a method of driving a touch display device, which includes time-dividing, by using a touch synchronization signal, each frame period into a plurality of display operation periods for dividing and driving a pixel matrix and a plurality of touch operation periods for dividing and driving a plurality of touch electrodes disposed in the pixel matrix, and during at least one compensation period of a first compensation period adjacent to an immediately preceding touch operation period and a second compensation period adjacent to an immediately following touch operation period in each display operation period, compensating at least one of a data signal and a gate signal, which is to be supplied to a compensation area, according to a variation in state of a panel during the touch operation period.

The compensating of the data signal may apply the compensation data according to the information on the compensation area during each compensation period of each display operation period to data of subpixels belonging to the compensation area to output the compensated data and output data without compensation during the remaining period of each display operation period.

The compensating of the gate signal may adjust pulse widths or voltage levels of the gate signal of the gate lines belonging to the compensation area according to the information on the compensation area and compensation information during each compensation period of the display operation period.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
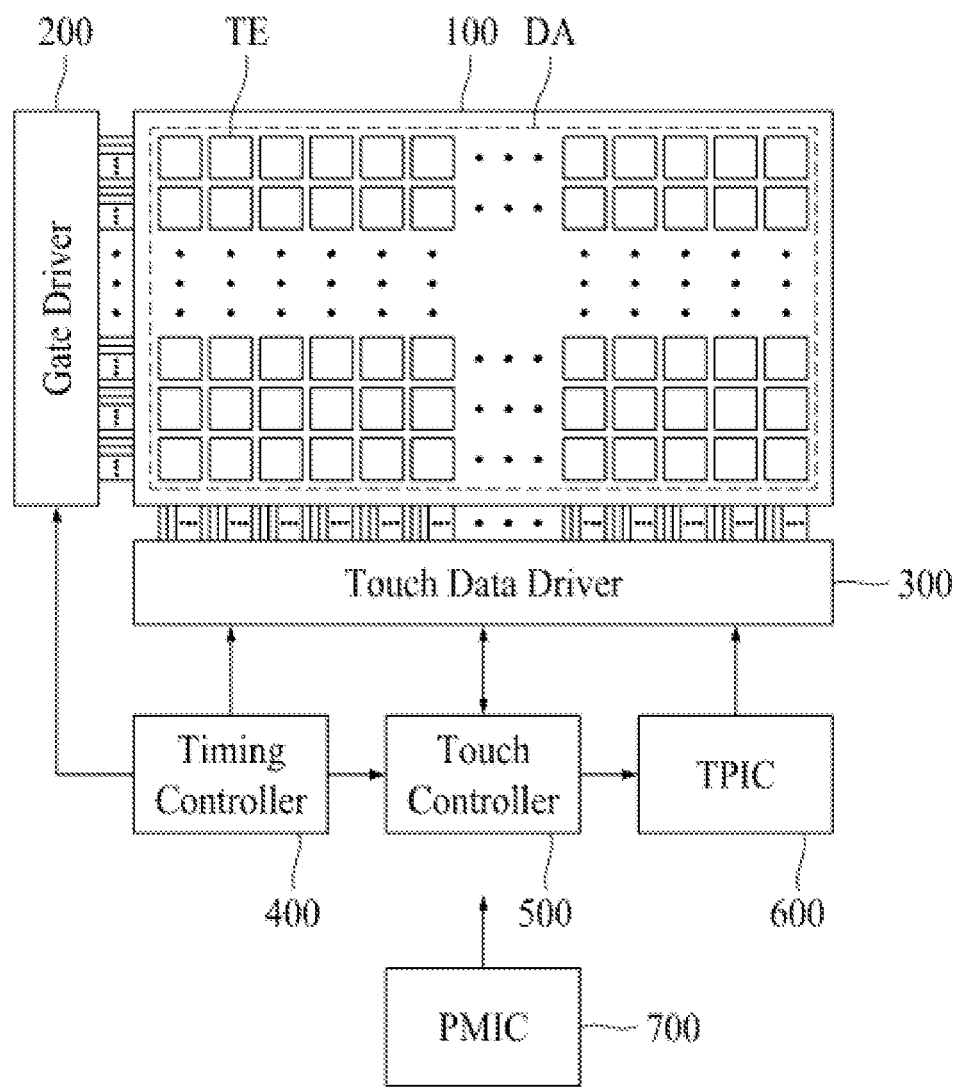
FIG. 1 is a block diagram illustrating a configuration of a touch display device according to one embodiment.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

As used herein, the term "part" refers to software or a hardware component such as a field-programmable gate array (FPGA) or an application-specific integrated circuit (ASIC), and the "part" performs certain functions. However, the "part" is not limited to software or hardware. The "part" may be configured to be stored in a storage medium that may be addressed or may be configured to be executed by one or more processors. Therefore, the "part" includes, for example, software components, processes, functions, drivers, firmware, circuits, data, database, and tables.

Hereinafter, exemplary embodiments of the present disclosure will be described in detail with reference to the accompanying drawings.

Figure 2:
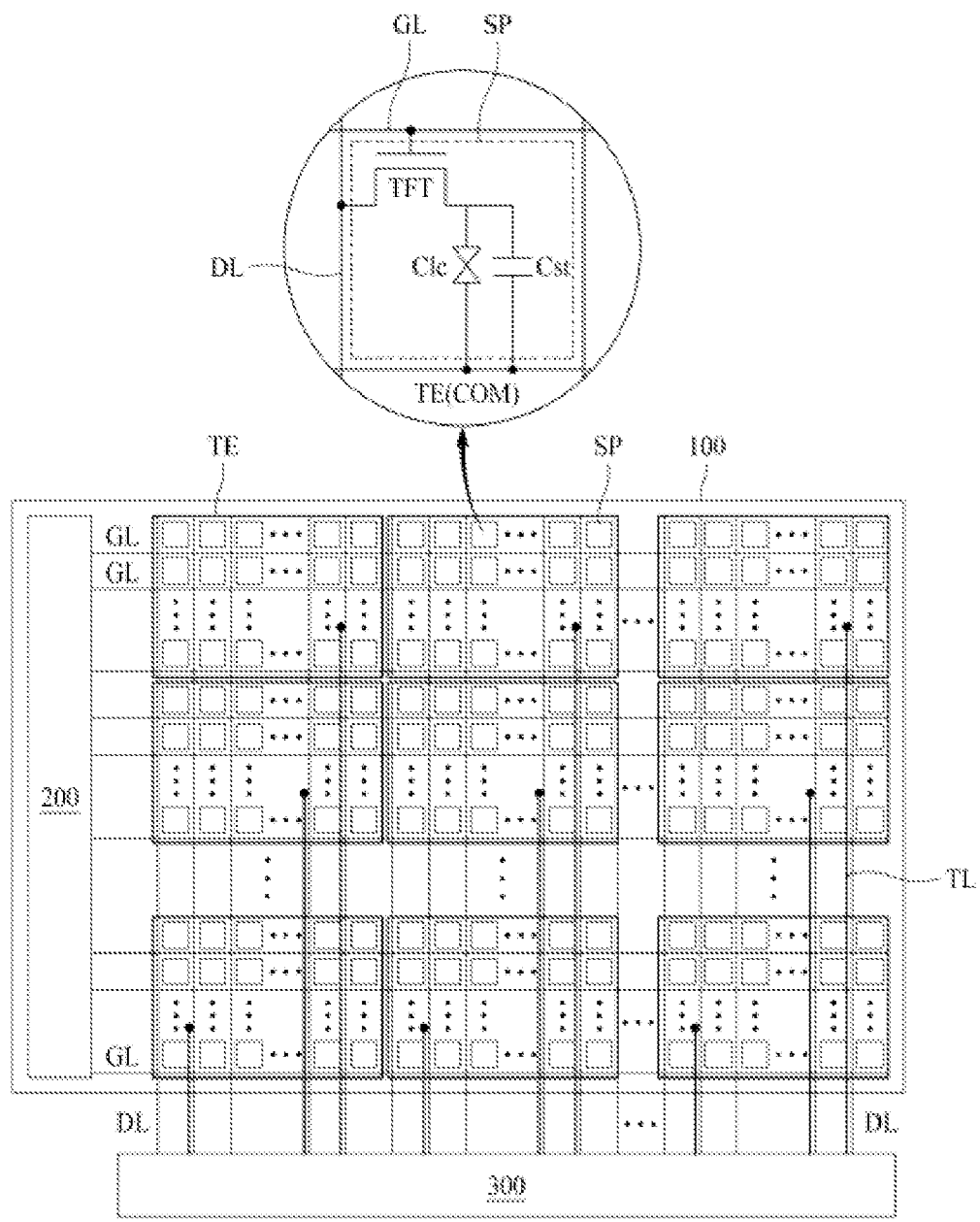
FIG. 2 is a diagram illustrating a configuration of a touch electrode and a subpixel in a panel according to one embodiment.

FIG. 1 is a schematic block diagram illustrating a configuration of a touch display device according to one embodiment, and FIG. 2 is a diagram illustrating a configuration of a touch electrode and a subpixel in a panel according to one embodiment.

Referring to FIG. 1, the touch display device includes a panel 100, a gate driver 200, a touch data driver 300, a timing controller 400, a touch controller 500, a touch power integrated circuit (TPIC) 600, and a power management integrated circuit (PMIC) 700. The gate driver 200 and the touch data driver 300 may be defined as panel drivers. The PMIC 700 and the TPIC 600 may be defined as power circuits.

The panel 100 has a touch sensing function and a display function. The panel 100 displays an image through a display area DA in which subpixels are disposed in the form of a matrix. The panel 100 detects the presence or absence of a touch, in a capacitive method, using touch electrodes (TE), which are used as a common electrode, included in a pixel matrix of the display area DA. A capacitive touch sensing method may use any one of a mutual capacitance touch sensing method and a self-capacitance touch sensing method. In the embodiment of the present disclosure, a self-capacitance touch sensing method will be described as an example.

Each subpixel SP is any one among a red subpixel for emitting red light, a green subpixel for emitting green light, a blue subpixel for emitting blue light, and a white subpixel for emitting white light and is independently driven by at least one thin film transistor (TFT). A unit pixel may be formed of a combination of two, three, or four subpixels having different colors.

A gate electrode of the TFT included in each subpixel SP is connected to the gate driver 200 through a gate line GL disposed in the panel 100, and one input electrode of any one of a source electrode and a drain electrode of each TFT is connected to the touch data driver 300 through a data line DL disposed in the panel 100.

For example, as shown in FIG. 2, each subpixel SP includes the TFT connected to the gate line GL and a data line DL, and a liquid crystal capacitor Clc and a storage capacitor Cst which are connected to the TFT and the touch electrode TE which is a common electrode COM. The liquid crystal capacitor Clc is charged with a difference voltage between a voltage of a data signal supplied to a pixel electrode through the TFT and a common voltage supplied to the touch electrode TE and drives a liquid crystal according to the charged voltage to control light transmittance. The storage capacitor Cst stably maintains the voltage charged in the liquid crystal capacitor Clc.

The panel 100 includes a touch electrode matrix formed of touch electrodes TE each having a common electrode function of a pixel matrix and a touch sensor function. As shown in FIG. 2, the touch electrode matrix includes a plurality of touch electrode columns, and each touch electrode column includes a plurality of touch electrodes TE disposed in a direction of the data line DL and a plurality of touch routing lines TL which connect each of the plurality of touch electrodes TE to the touch data driver 300. The plurality of touch electrodes TE are formed such that the common electrode COM located in the pixel matrix is divided into a plurality of segments, and each touch electrode TE is formed at a predetermined size including a plurality of subpixels SP in consideration of a size of a touch point. Each touch electrode TE is connected in common to a plurality of subpixels SP overlapping each touch electrode TE and forms one touch sensor.

The PMIC 700 receives an input voltage and generates and supplies a plurality of driving voltages required in the touch display device. By using the input voltage, the PMIC 700 may generate and supply a plurality of driving voltages required in the TPIC 600, the timing controller 400, the touch controller 500, the gate driver 200, and the touch data driver 300. For example, the PMIC 700 may generate and supply a digital circuit driving voltage to each driving circuit and may generate and supply an analog circuit driving voltage to the TPIC 600 and the touch data driver 300. The PMIC 700 may generate and supply driving voltages required in the gate driver 200. The PMIC 700 may generate and supply a common voltage VCOM to the TPIC 600.

The TPIC 600 may receive the output voltage of the PMIC 700 and a control signal of the touch controller 500 and may generate and output a plurality of driving signals required in driving circuits related to touch driving and sensing, such as the gate driver 200 and touch data driver 300.

Under the control of the touch controller 500, the TPIC 600 may supply the common voltage VCOM, which is supplied from the PMIC 700 during the display operation period, to the touch data driver 300. The TPIC 600 may generate a touch driving signal of an alternating-current (AC) waveform according to a pulse width modulation (PWM) signal supplied from the touch controller 500 during the touch operation period and supply the touch driving signal to the touch data driver 300. Meanwhile, the TPIC 600 may generate a gate-off modulation signal having the same phase and the same amplitude as the touch driving signal according to the PWM signal during the touch operation period and further supply the gate-off modulation signal to the gate driver 200.

The timing controller 400 may receive image data and synchronization signals from a host system (not shown). For example, the host system may be any one among a computer, a television (TV) system, a set-top box, and a system of a portable terminal such as a tablet or a mobile phone. The synchronization signal may include a dot clock, a data enable signal, a vertical synchronization signal, and a horizontal synchronization signal.

By using timing signals supplied from the host system and timing information stored in a register, the timing controller 400 may generate a touch synchronization signal for time-division driving each frame in a plurality of display operation periods and a plurality of touch operation periods and may supply the generated touch synchronization signal to the touch controller 500 and the touch data driver 300. The touch synchronization signal may control each display operation period and each touch operation period to be alternated.

Each display operation period DP (see FIG. 3), which is distinguished by the touch synchronization signal, refers to a period in which image data is charged (written) in the subpixels of a corresponding pixel block in the panel 100 through the panel drivers 200 and 300. Each touch operation period TP (see FIG. 3) refers to a period in which a touch driving signal is applied to the touch electrodes TE of a corresponding touch block in the panel 100 and a capacitance variation is read out from a corresponding touch electrode TE.

By using the supplied synchronization signals, the supplied touch synchronization signal, and timing setting information (including a start timing, a pulse width, and the like) stored in the register, the timing controller 400 may generate data control signals for controlling an operation timing of the touch data driver 300 and supply the data control signals to the touch data driver 300. For example, the data control signals may include a source start pulse used to control a latch timing of data, a source sampling clock, a source output enable signal for controlling an output timing of data, and a polarity control signal for controlling a polarity of the data signal.

By using the supplied synchronization signals, the supplied touch synchronization signal, and the timing setting information stored in the register, the timing controller 400 may generate gate control signals for controlling an operation timing of the gate driver 200 and supply the gate control signals to the gate driver 200. For example, the gate control signals may include a gate start pulse used in a shift register operation of the gate driver 200, a gate shift clock, and a gate output enable signal for controlling an output timing of a gate pulse.

The timing controller 400 may store image data, which is supplied from the system, in a memory. The timing controller 400 may perform various processes for image quality compensation and power consumption reduction on the image data and store the processed image data. During each display operation period DP, the timing controller 400 may read image data of a corresponding pixel block from the memory at a read speed that is faster than a write speed and supply the image data and the data control signals to the touch data driver 300.

In particular, during the display operation period DP, the timing controller 400 may further include a compensation period CP (see FIG. 3) for compensating for a state variation in the panel 100 due to a touch operation using the image data or the gate signal and may prevent distortion of a display image due to the touch operation period TP. The compensation period CP may include at least one of a first period (an initial period) and a second period (a late period) adjacent to the touch operation period TP among the display operation periods DP.

During the compensation period CP of each display operation period DP, according to compensation information preset in the register, the timing controller 400 may compensate image data to be charged in a corresponding subpixel, adjust a pulse width timing or a voltage level of the gate signal for determining a period of supplying (writing) the data signal to a corresponding subpixel to compensate the gate signal, or perform both of the image data compensation and the gate signal compensation.

To this end, compensation information in consideration of a degree of the state variation of the panel 100 due to the touch operation may be preset and stored in the register of the timing controller 400.

For example, the state of the panel 100 may be varied such that a parasitic capacitance between the touch electrode TE and the data line DL or between the touch electrode TE and the gate line GL is varied due to the touch operation period TP. Due to the variation of the panel 100, the data signal or the gate signal driven during the display operation period DP adjacent to the touch operation period TP is distorted, and thus the data signal charged in the corresponding subpixel may be distorted. In order to solve the problem, in consideration of the degree of variation of the panel 100 due to the touch operation period TP or a degree of distortion of the data signal or the gate signal, compensation information may be preset, and the preset compensation information may be stored in the register.

The touch controller 500 may receive the touch synchronization signal from the timing controller 400, generate a PWM signal and touch control signals which are required for touch sensing, and supply the PWM signal and the touch control signals to the touch data driver 300 and the TPIC 600. The touch controller 500 may receive touch sensing data from the touch data driver 300, generate touch coordinates of a touch node at which a touch is generated, and supply the touch coordinates to the host system.

The gate driver 200 may receive the gate control signals from the timing controller 400, generate a gate pulse (scan pulse) according to the gate control signals during the display operation period DP, and sequentially and individually drive the gate lines GL of the corresponding pixel block. During each display operation period DP, the gate driver 200 may supply a gate pulse of a gate-on voltage to a corresponding gate line GL at each driving period of the corresponding gate line GL according to the gate control signal, and during a non-driving period of the corresponding gate line GL, the gate driver 200 may supply a gate-off voltage, which is supplied from the TPIC 600 or the PMIC 700, to the corresponding gate line GL.

Meanwhile, during each touch operation period TP, the gate driver 200 may supply a gate-off modulation signal, which is supplied from the TPIC 600, to the gate lines GL.

In particular, under the control of the timing controller 400, the gate driver 200 may supply the gate signal, which is compensated for in the compensation period CP during each display operation period DP, to the corresponding gate line GL, thereby correcting a state variation of the panel 100 or distortion of the gate signal after a touch operation.

The gate driver 200 may be formed in a TFT substrate together with a TFT array constituting the pixel matrix of the panel 100 to be embedded in a bezel area of the panel 100 as a gate in panel (GIP) type. The GIP type gate driver 200 may be located on one side portion of panel 100 or both side portions thereof. Meanwhile, the gate driver 200 may be formed of a plurality of gate integrated circuits (ICs), may be individually mounted on a circuit film such as a chip on film (COF), and may be bonded to the panel 100 using a tape automatic bonding (TAB) method or may be mounted on the panel 100 using a chip on glass (COG) method.

The touch data driver 300 may receive the image data and the data control signals from the timing controller 400, convert the image data into analog data signals during each display operation period DP, and supply the analog data signals to the data lines DL of the panel 100. The touch data driver 300 may convert digital image data into the analog data signals using gradation voltages in which a plurality of reference gamma voltages supplied from a gamma voltage generator (not shown) are segmented. During each display operation period DP, the touch data driver 300 may supply the common voltage VCOM, which is supplied from the TPIC 600, to the touch electrodes TE through the touch routing lines TL to allow the touch electrodes TE to operate as common electrodes.

During each touch operation period TP, the touch data driver 300 may supply the touch driving signal supplied from the TPIC 600 to the touch electrodes TE of the corresponding block through the touch routing lines TL of the corresponding block. Meanwhile, during the touch operation period TP, the touch data driver 300 may supply a touch driving signal to the data lines DL.

The touch data driver 300 may include a built-in readout circuit, supply the touch driving signal to the touch electrodes TE of the corresponding touch block through the touch routing lines TL during each touch operation period TP, and then read out a signal fed back from each touch electrode TE through an individual touch routing line TL. The touch data driver 300 may differentially amplify the touch driving signal and the readout signal with respect to each touch electrode TE to sense a variation in self-capacitance (a signal delay amount) of each touch electrode TE due to a touch, generate touch sensing data through signal processing, and supply the touch sensing data to the touch controller 500.

In particular, under the control of the timing controller 400, the touch data driver 300 may supply the data signal, which is compensated for in the compensation period CP during each display operation period DP, to charge a corresponding subpixel, thereby correcting the state variation of the panel 100 or distortion of a gate signal after the touch operation.

The touch data driver 300 may be formed of one or more touch data ICs, and each IC may be individually mounted on a circuit film such as a COF and bonded to the panel 100 using a TAB method or mounted on the panel 100 using a COG method.

Meanwhile, during the touch sensing period TD, the gate driver 200 and the touch data driver 300, that is, the panel drivers 200 and 300, may supply the touch driving signal to the data lines DL of the panel 100 and supply a gate-off modulation signal having the same phase and the same amplitude as the touch driving signal to the gate lines GL, thereby allowing the touch electrodes TE to perform a load-free driving. That is, during the touch sensing period TD due to the load-free driving, the parasitic capacitance between the touch electrode TE and the gate line GL and between the touch electrode TE and the data line DL in the panel 100 may be minimized to minimize a resistor capacitor (RC) load of the touch electrodes TE. Consequently, signal distortion due to the RC load may be minimized to improve touch sensing sensitivity. In addition to a square wave in the form of a pulse, various waveforms such as trapezoid waves or sine waves may be used as the AC waveforms of the touch driving signal and the gate-off modulation signal.

Figure 3:
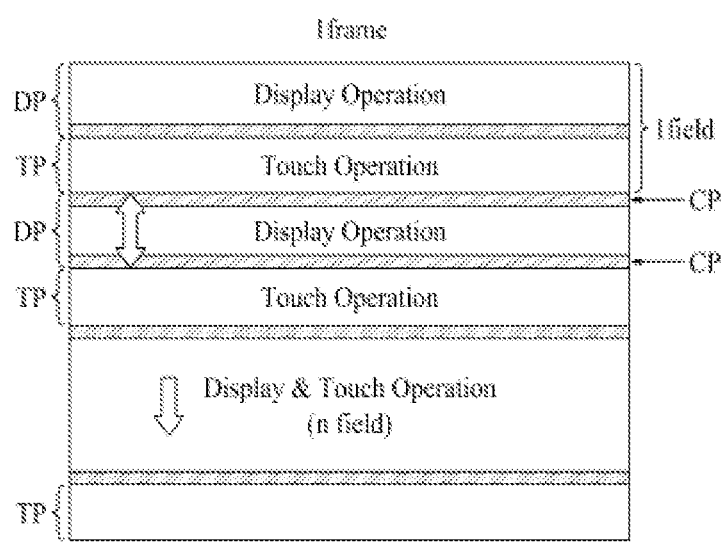
FIG. 3 is a diagram illustrating a time division driving method of one frame of the touch display device according to one embodiment.
Figure 4:
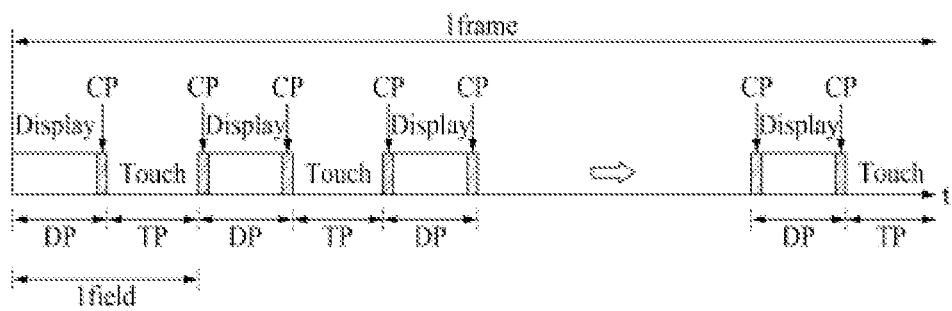
FIG. 4 is a timing diagram illustrating the time division driving method of one frame of the touch display device according to one embodiment.
Figure 5:
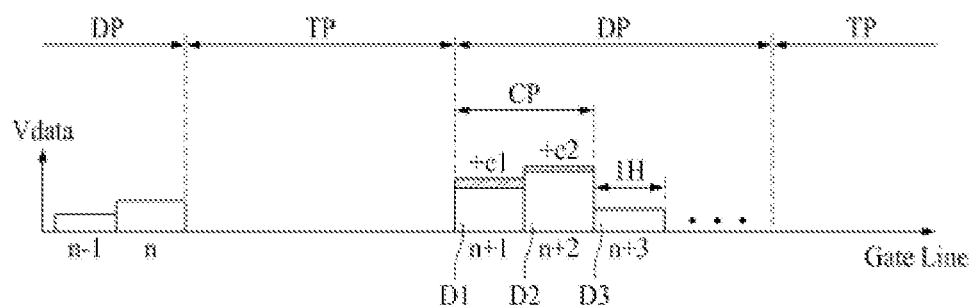
FIG. 5 is a timing diagram illustrating a data compensation method of the touch display device according to one embodiment.
Figure 6:
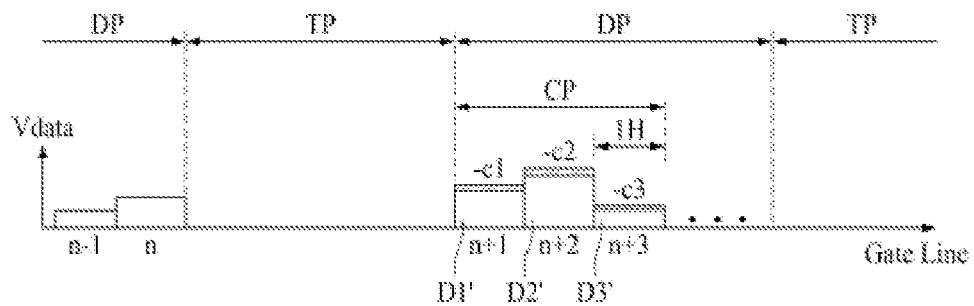
FIG. 6 is a timing diagram illustrating the data compensation method of the touch display device according to one embodiment.

FIGS. 3 and 4 are timing diagrams illustrating the time division driving method of one frame of the touch display device according to one embodiment, and FIGS. 5 and 6 are timing diagrams illustrating the data compensation method of the touch display device according to one embodiment.

Referring to FIGS. 3 and 4, under the control of the touch synchronization signal generated from the timing controller 400, each frame period may include a plurality of display operation periods DP for time-divisionally driving the pixel matrix of the panel 100 as a plurality of pixel blocks, and a plurality of touch operation periods TP for time-divisionally driving the touch electrode matrix of the panel 100 as a plurality of touch blocks, and each display operation period DP and each touch operation period TP may operate alternately. One display operation period DP and one touch operation period TP may be defined as one field period. In each frame, the pixel matrix may be scanned once by the plurality of display operation periods DP, whereas the touch electrode matrix may be driven and sensed twice or more by the plurality of touch operation periods TP.

During each touch operation period TP, the touch data driver 300 may supply the touch driving signal, which is supplied from the TPIC 600, to touch routing lines TL of a corresponding touch block and read out a variation in capacitance of each of the electrodes TE of the corresponding touch block through the corresponding touch routing lines TL. The touch data driver 300 may perform signal processing on the readout signal to convert the processed readout signal into touch sensing data indicating whether a touch occurs and may supply the touch sensing data to the touch controller 500.

Meanwhile, during each touch operation period TP, for load-free driving, the touch data driver 300 may supply the touch driving signal to the data lines DL, and the gate driver 200 may supply the gate-off modulation signal, which is supplied from the TPIC 600, to the gate lines GL.

During each display operation period DP, under the control of the timing controller 400, the touch data driver 300 converts the image data, which is supplied in each horizontal period, into an analog data signal to supply the analog data signal to the data lines DL of the panel 100 and supply the common voltage VCOM, which is supplied from the TPIC 600, to the touch electrodes TE through the touch routing lines TL. During each display operation period DP, under the control of the timing controller 400, the gate driver 200 sequentially drives the gate lines GL of the corresponding pixel block to allow the data signal, which is supplied to the data lines DL in each horizontal period, to be supplied to and charged in the corresponding subpixel.

In particular, at least one of the first period and the second period of each display operation period DP adjacent to the touch operation period TP may include the compensation period CP. During each compensation period CP, under the control of the timing controller 400, the panel drivers 200 and 300 may supply the compensated data signal or the compensated gate signal to the subpixels SP of the horizontal lines corresponding to a compensation area in the panel 100.

For example, as shown in FIG. 5, during the compensation period CP of the display operation period DP after the touch operation period TP, data signals D1 and D2, which are compensated by adding compensation data +c1 and +c2, may be supplied to and charged in subpixels of $(n+1)^{th}$ and $(n+2)^{th}$ horizontal lines which are driven $(n+1)^{th}$ and $(n+2)^{th}$ gate lines in the compensation area. The first compensation data +c1 added to the subpixel of the $(n+1)^{th}$ horizontal line may be different from or the same as the second compensation data +c2 added to the subpixels of the $(n+2)^{th}$ horizontal line. That is, the pieces of compensation data may be set to be different from each other or to be identical to each other for each horizontal line in each compensation area. An uncompensated data signal D3 may be supplied to and charged in subpixels of a $(n+3)^{th}$ horizontal line driven by a $(n+3)^{th}$ gate line.

On the other hand, as shown in FIG. 6, during the compensation period CP of the display operation period DP after the touch operation period TP, data signals D1', D2', and D3', which are compensated by adding compensation data −c1, −c2, and −c3, may be supplied to and charged in subpixels of $(n+1)^{th}$, $(n+2)^{th}$, and $(n+3)^{th}$ horizontal lines which are driven by $(n+1)^{th}$, $(n+2)^{th}$, and $(n+3)^{th}$ gate lines in the compensation area. The first compensation data +c1 added to the subpixel of the $(n+1)^{th}$ horizontal line, the second compensation data +c2 added to the subpixels of the $(n+2)^{th}$ horizontal line, and the second compensation data +c3 added to the subpixels of the $(n+3)^{th}$ horizontal line may be different from each other or the same.

As described above, during at least one compensation period CP of the first and second compensation periods CP of each display operation period DP adjacent to the touch operation period TP, the compensated data signal may be supplied to the subpixels SP of the corresponding horizontal line of the compensation area. Alternatively, a gate signal of which pulse width or voltage level is compensated for may be supplied to the gate line of the corresponding horizontal line of the compensation area. Accordingly, during the compensation period CP of each display operation period DP, the state variation of the panel 100 due to the touch operation in the subpixels of the compensation area may be corrected to a normal state. Consequently, in an image displayed on the panel 100, a distortion phenomenon in the horizontal lines is prevented so that display performance including picture quality may be improved.

Figure 7:
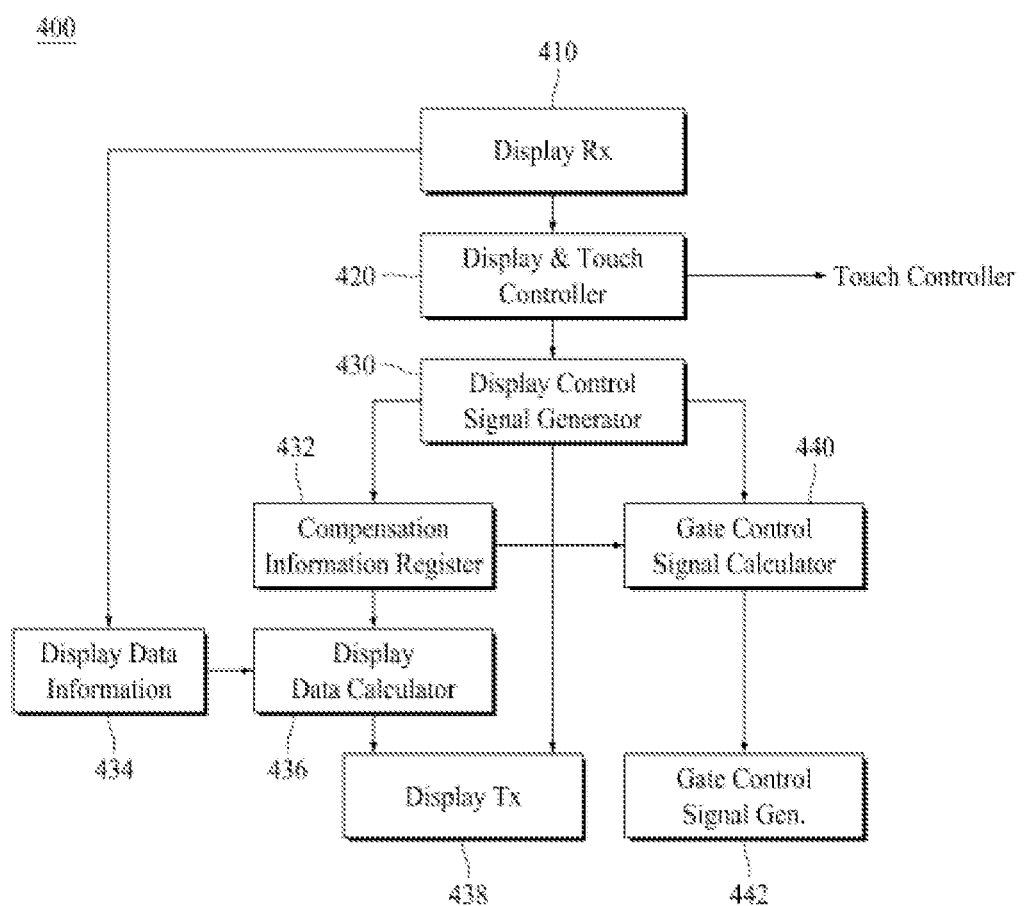
FIG. 7 is a block diagram illustrating an internal configuration of a timing controller in the touch display device according to one embodiment.

FIG. 7 is a block diagram illustrating an internal configuration of the timing controller 400 in the touch display device according to one embodiment.

Referring to FIG. 7, the timing controller 400 according to one embodiment may receive display data and synchronization signals (including a vertical synchronization signal, a horizontal synchronization signal, a dot clock, and a data enable signal) from the host system through a display receiver 410. The display receiver 410 may store the received display data in a memory 434 for storing display data information. The display receiver 410 may supply the received synchronization signals (including the vertical synchronization signal, the horizontal synchronization signal, the dot clock, and the data enable signal) to a display & touch controller 420.

By using the received synchronization signals, the display & touch controller 420 may generate a touch synchronization signal for determining the display operation period DP and the touch operation period TP and supply the generated touch synchronization signal and other synchronization signals to a display control signal generator 430. The display & touch controller 420 may output the touch synchronization signal to the touch controller 500.

By using the touch synchronization signal and the other synchronization signals, which are provided from the display & touch controller 420, the display control signal generator 430 may generate data control signals for controlling the touch data driver 300 during each display operation period DP. The display control signal generator 430 may output the data control signals to a display transmitter 438. The display control signal generator 430 may output the touch synchronization signal and the other synchronization signals to a gate control signal calculator 440 or a gate control signal generator 443.

Under the control of the display control signal generator 430, the compensation information register 432 may output compensation data to be supplied during the compensation period CP of the display operation period DP and compensation area information (position information of the horizontal line) to which the compensation data is to be supplied to a display data calculator 436. Meanwhile, the compensation information register 432 may output the compensation area information and compensation information of the gate signal to the gate control signal calculator 440. The compensation information stored in the compensation information register 432 is preset and stored therein.

During the compensation period CP of each display operation period DP, the display data calculator 436 may apply the compensation data provided from the compensation information register 432 to the display data provided from the memory 434, generate compensated display data, and output the compensated display data to the display transmitter 438. During each display operation period DP, the display data calculator 436 may apply the compensation data according to the compensation area information provided from the compensation information register 432 to the display data of the corresponding horizontal line, compensate the display data, and output the compensated display data to the display transmitter 438. The display data calculator 436 outputs the display data not requiring compensation to the display transmitter 438 without compensation.

The display transmitter 438 (Display Tx) may convert the display data supplied from the display data calculator 436 and the data control signals supplied from the display control signal generator 430 into transmission data in a high-speed serial interface manner and transmit the transmission data to the touch data driver 300.

By using the touch synchronization signal and the other synchronization signals provided from the display control signal generator 430, and the compensation area information and the compensation information provided from the compensation information register 432, the gate control signal calculator 440 may generate a gate compensation signal for adjusting a timing such as a pulse width of the gate signal to be supplied to the gate line of the compensation area (the horizontal line) or adjusting a voltage level of the gate signal. The gate control signal calculator 440 may output the touch synchronization signal, the other synchronization signals, and the generated gate compensation signal to a gate control signal generator 442. The gate control signal calculator 440 may be omitted.

By using the touch synchronization signal, the other synchronization signals, and the gate compensation signal, which are provided from the gate control signal calculator 440, the gate control signal generator 442 may generate gate control signals for controlling the gate driver 200 during each display operation period DP. On the other hand, when the gate control signal calculator 440 is omitted, by using the touch synchronization signal and the other synchronization signals, which are provided from the display control signal generator 430, the gate control signal generator 442 may generate the gate control signals for controlling the gate driver 200 during each display operation period DP. The gate control signal generator 442 may output the gate control signals to the gate driver 200.

Figure 8:
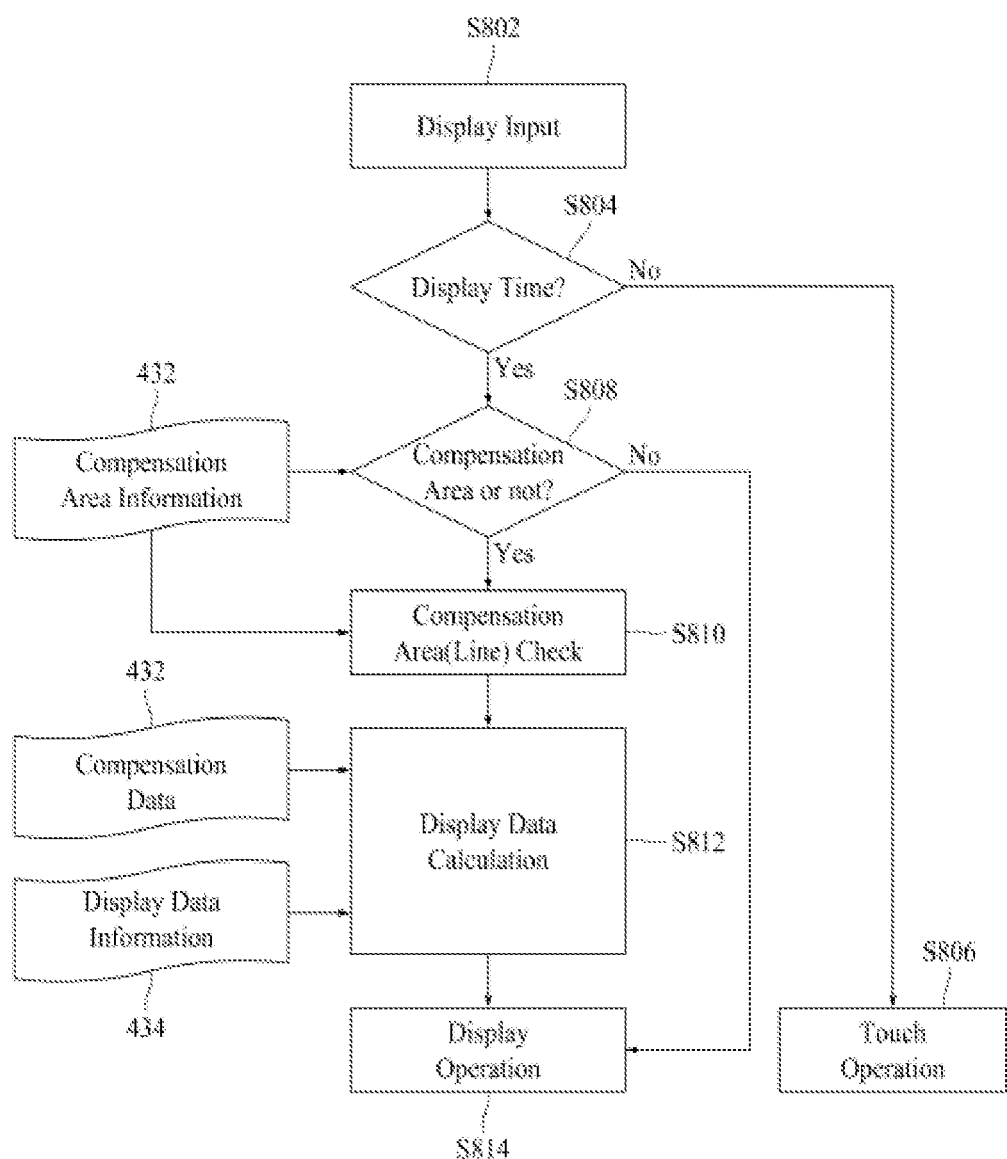
FIG. 8 is a flowchart illustrating a method of driving a touch display device according to one embodiment.

FIG. 8 is a flowchart illustrating a method of driving a touch display device according to one embodiment, and the method is performed by the timing controller 400 shown in FIG. 1.

Referring to FIG. 8, the timing controller 400 inputs display data and synchronization signals supplied from the host system (S802). The timing controller 400 stores the display data in the memory 434 which stores display data information. By using the synchronization signals, the timing controller 400 generates a touch synchronization signal for determining the display operation period DP and the touch operation period TP.

The timing controller 400 may determine whether the touch synchronization signal indicates the display operation period DP or the touch operation period TP (S804).

When the timing controller 400 outputs the touch synchronization signal to the touch controller 500 and thus the touch synchronization signal indicates the touch operation period TP (No of S804), the timing controller 400 allows the panel 100 to perform a touch operation through the touch controller 500 (S806).

When the touch synchronization signal indicates the display operation period DP (Yes of S804), the timing controller 400 determines whether a compensation area is stored in the compensation information register 432 (S808).

In the case of the compensation area (S808), the timing controller 400 checks the compensation area in units of horizontal lines using the compensation area information stored in the compensation information register 432 (S810).

By using the compensation data stored in the compensation information register 432 and the display data stored in the memory 434 for each horizontal line in the compensation area, the timing controller 400 may perform a compensation operation on the display data of the compensation area and output the compensated display data (S812).

The timing controller 400 outputs the compensated display data to the touch data driver 300, and thus the compensated display data is supplied to the panel 100 during the display operation period DP. When not in the case of the compensation area (No of S808), the timing controller 400 outputs the display data to the touch data driver 300 without compensation, and thus the display data is supplied to the panel 100 during the display operation period DP.

As described above, during some of the display operation periods adjacent to the touch operation period, the touch display device, the driving method thereof, and the timing controller according to one embodiment may compensate for a degree of the state variation of the panel 100 due to the touch operation using at least one among the data signal and the gate signal, thereby correcting the state variation of the panel 100 to a normal state. Consequently, it is possible to prevent a distortion phenomenon in which the horizontal lines occur in an image displayed on panel 100, thereby improving display performance such as image quality.

Although the example in which the touch display device according to one embodiment is applied to a liquid crystal display device has been described, the touch display device can be applied to any one among various display devices including electroluminescent display devices and micro light emitting diode (LED) display devices. The electroluminescent display device may be an organic LED (OLED) display device, a quantum-dot LED display device, or an inorganic LED display device.

The touch display device including the same according to the embodiment may be applied to various electronic devices. For example, the touch display device including the same according to the embodiment may be applied to a mobile device, a video phone, a smart watch, a watch phone, a wearable device, a foldable device, a rollable device, a bendable device, a flexible device, a curved device, an electronic notebook, an e-book, a portable multimedia player (PMP), a personal digital assistant (PDA), an MPEG audio layer-3 player, a mobile medical device, a desktop personal computer (PC), a laptop PC, a netbook computer, a workstation, a navigation device, a vehicle navigation device, a vehicle display device, a television, a wallpaper display device, a signage device, a game device, a notebook computer, a monitor, a camera, a camcorder, a home appliance, and the like.

Features, structures, effects, etc. described above in various examples of the present disclosure are included in at least one example of the present disclosure and are not necessarily limited to only one example. Furthermore, features, structures, effects, etc. illustrated in at least one example of the present disclosure may be combined or modified for other examples by those skilled in the art to which the technical idea of the present disclosure pertains. Therefore, the contents related to such combinations and modifications should be interpreted as being included in the technical spirit or scope of the present disclosure.

While the present disclosure described above is not limited to the above-described embodiments and the accompanying drawings, it will be apparent to those skilled in the art to which the present disclosure belongs that various substitutions, modifications, and changes may be made herein without departing from the scope of the present disclosure. Therefore, the scope of the present disclosure is defined by the appended claims, and all changes or modifications derived from the meaning, scope, and equivalence of the claims are to be construed as being included in the scope of the present disclosure.

What is claimed is:

1. A touch display device, the touch display device comprising:
   a panel driver configured to drive gate lines and data lines of a panel, and drive and sense touch electrodes; and
   a timing controller configured to control a drive timing of the panel driver and an output of the panel driver,
   wherein the timing controller time-divisionally drives each frame period into at least one display operation period and at least one touch operation period, and
   during the at least one display operation period, the timing controller compensates both a data signal and a gate signal according to a variation in state of the panel during the at least one touch operation period.

2. The touch display device of claim 1, wherein the at least one display operation period further includes at least one compensation period.

3. The touch display device of claim 1, during the at least one display operation period, data signals D1 and D2, which are compensated by adding compensation data +c1 and +c2, are supplied to and charged in subpixels of (n+1)th and (n+2)th horizontal lines which are driven (n+1)th and (n+2)th gate lines in the compensation area.

4. The touch display device of claim 3, wherein the first compensation data c+1 added to the subpixel of the (n+1)th horizontal line is different from the second compensation data c+2 added to the subpixels of the (n+2)th horizontal line.

5. The touch display device of claim 3, wherein the first compensation data c+1 added to the subpixel of the (n+1)th horizontal line is same as the second compensation data c+2 added to the subpixels of the (n+2)th horizontal line.

6. The touch display device of claim 3, wherein uncompensated data signal D3 is supplied to and charged in subpixels of a (n+3)th horizontal line driven by a (n+3)th gate line.

7. The touch display device of claim 1, wherein the at least one display operation period includes a period in which image data is written in subpixels of a corresponding pixel block in the panel.

8. The touch display device of claim 1, wherein the at least one touch operation period includes a period in which a touch driving signal is applied to the touch electrodes of a corresponding touch block in the panel and a capacitance variation is read out from a corresponding touch electrode.

9. A touch display device, the touch display device comprising:
   a panel driver configured to drive gate lines and data lines of a panel, and drive and sense touch electrodes; and
   a timing controller configured to control a drive timing of the panel driver and an output of the panel driver,
   wherein the timing controller time-divisionally drives each frame period into at least one display operation period and at least one touch operation period, and
   during the at least one display operation period, the timing controller compensates at least one data signal according to a variation in state of the panel during the at least one touch operation period.

10. The touch display device of claim 9, wherein the at least one display operation period further includes at least one compensation period.

11. The touch display device of claim 9, during the at least one display operation period, data signals D1 and D2, which are compensated by adding compensation data +c1 and +c2, are supplied to and charged in subpixels of (n+1)th and (n+2)th horizontal lines which are driven (n+1)th and (n+2)th gate lines in the compensation area.

12. The touch display device of claim 11, wherein the first compensation data c+1 added to the subpixel of the (n+1)th horizontal line is different from the second compensation data c+2 added to the subpixels of the (n+2)th horizontal line.

13. The touch display device of claim 11, wherein the first compensation data c+1 added to the subpixel of the (n+1)th horizontal line is same as the second compensation data c+2 added to the subpixels of the (n+2)th horizontal line.

14. The touch display device of claim 11, wherein uncompensated data signal D3 is supplied to and charged in subpixels of a (n+3)th horizontal line driven by a (n+3)th gate line.

15. The touch display device of claim 9, wherein the at least one display operation period includes a period in which image data is written in subpixels of a corresponding pixel block in the panel.

16. The touch display device of claim 9, wherein the at least one touch operation period includes a period in which a touch driving signal is applied to the touch electrodes of a corresponding touch block in the panel and a capacitance variation is read out from a corresponding touch electrode.

17. A touch display device, the touch display device comprising:
  a panel driver configured to drive gate lines and data lines of a panel, and drive and sense touch electrodes; and
  a timing controller configured to control a drive timing of the panel driver and an output of the panel driver,
  wherein the timing controller time-divisionally drives each frame period into at least one display operation period and at least one touch operation period, and during the at least one display operation period, the timing controller compensates at least one gate signal, according to a variation in state of the panel during the at least one touch operation period.

18. The touch display device of claim 17, wherein the at least one display operation period further includes at least one compensation period.

19. The touch display device of claim 17, wherein the at least one display operation period includes a period in which image data is written in subpixels of a corresponding pixel block in the panel.

20. The touch display device of claim 17, wherein the at least one touch operation period includes a period in which a touch driving signal is applied to the touch electrodes of a corresponding touch block in the panel and a capacitance variation is read out from a corresponding touch electrode.

* * * * *